(12) United States Patent
Namgung et al.

(10) Patent No.: US 9,329,475 B2
(45) Date of Patent: May 3, 2016

(54) POSITIVE PHOTOSENSITIVE RESIN COMPOSITION, PHOTOSENSITIVE RESIN FILM PREPARED BY USING THE SAME, AND DISPLAY DEVICE

(71) Applicant: Cheil Industries Inc., Gumi-si (KR)

(72) Inventors: Ran Namgung, Uiwang-si (KR); Hyo-Young Kwon, Uiwang-si (KR); Hwan-Sung Cheon, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 14/283,274

(22) Filed: May 21, 2014

(65) Prior Publication Data

US 2015/0111153 A1    Apr. 23, 2015

(30) Foreign Application Priority Data

Oct. 23, 2013 (KR) .......................... 10-2013-0126541

(51) Int. Cl.
| | | |
|---|---|---|
| *G03F 7/023* | (2006.01) | |
| *C08G 69/26* | (2006.01) | |
| *C08G 73/22* | (2006.01) | |
| *G03F 7/039* | (2006.01) | |

(52) U.S. Cl.
CPC ................ *G03F 7/023* (2013.01); *G03F 7/039* (2013.01); *C08G 69/26* (2013.01); *C08G 73/22* (2013.01)

(58) Field of Classification Search
CPC ......... G03F 7/023; C08G 69/26; C08G 73/22
USPC .................. 430/18, 190, 191, 192, 193, 165; 528/335, 341, 344
See application file for complete search history.

(56) References Cited

U.S. PATENT DOCUMENTS

| | | | |
|---|---|---|---|
| 5,037,720 A | 8/1991 | Khanna | |
| 6,143,467 A * | 11/2000 | Hsu et al. | 430/270.1 |
| 7,803,510 B2 * | 9/2010 | Naiini et al. | 430/190 |
| 8,501,375 B2 | 8/2013 | Cho et al. | |
| 8,592,131 B2 | 11/2013 | Chung et al. | |
| 2009/0233228 A1 * | 9/2009 | Shibui | G03F 7/0233 430/281.1 |
| 2013/0137036 A1 * | 5/2013 | Jeong et al. | 430/283.1 |

FOREIGN PATENT DOCUMENTS

| | | |
|---|---|---|
| JP | 2005-351987 A | 12/2005 |
| KR | 10-2008-0036225 A | 4/2008 |
| KR | 10-2011-0069870 A | 6/2011 |
| KR | 10-2012-0066924 A | 6/2012 |
| TW | 581932 | 4/2004 |
| TW | 201227175 | 7/2012 |

OTHER PUBLICATIONS

Shin et al., "Synthesis and Micropatterning Properties of a Novel Base-Soluble, Positive-Working, Photosensitive Polyimide Having an o-Nitrobenzyl Ether Group", Journal of Polymer Science: Part A: Polymer Chemistry, vol. 45, 776-788 (2007).
Choi et al., "New base-soluble positive-working photosensitive polyimides having o-nitrobenzyl ester group", Polymers for Advanced Technologies, vol. 16, 387-392 (2005).
Search Report in counterpart Taiwanese Application No. 103118901 dated May 5, 2015, pp. 1.

* cited by examiner

*Primary Examiner* — John S Chu
(74) *Attorney, Agent, or Firm* — Additon, Higgins & Pendleton, P.A.

(57) ABSTRACT

Disclosed are a positive photosensitive resin composition including (A) a polybenzoxazole precursor including a functional group at a terminal end thereof, wherein the functional group is dissociated by light of about 400 nm to about 550 nm wavelength region and is acidified; (B) a photosensitive diazoquinone compound; and (C) a solvent, and a photosensitive resin film and a display device using the same.

9 Claims, No Drawings

POSITIVE PHOTOSENSITIVE RESIN COMPOSITION, PHOTOSENSITIVE RESIN FILM PREPARED BY USING THE SAME, AND DISPLAY DEVICE

CROSS-REFERENCE TO RELATED APPLICATION

This application claims priority to and the benefit of Korean Patent Application No. 10-2013-0126541 filed in the Korean Intellectual Property Office on Oct. 23, 2013, the entire disclosure of which is incorporated herein by reference.

FIELD OF THE INVENTION

This disclosure relates to a positive photosensitive resin composition, a photosensitive resin film prepared by using the same, and a display device including the photosensitive resin film.

BACKGROUND OF THE INVENTION

A conventional photosensitive resin is classified as a positive type in which an exposed part is dissolved or as a negative type in which an exposed part is cured and remains during development. The positive photosensitive resin may in general be synthesized by using polybenzoxazole having a phenol-based hydroxy group dissolved in an alkali an aqueous solution and the like.

The polybenzoxazole is a polymer having a rigid aromatic backbone. Polybenzoxazole can have excellent mechanical strength, chemical resistance, weather resistance, heat resistance, and/or shape stability based on cyclic chemical stability as well as excellent electric characteristics such as insulation properties and the like due to a low dielectric constant. Thus, polybenzoxazole is actively used in the manufacture of electric/electronic materials such as a display, a memory, a solar cell, and the like. Polybenzoxazole has also drawn attention as a material for use in automotive and aerospace fields.

In particular, positive photosensitive resin compositions including polybenzoxazole are increasingly used in the display area as an organic insulation layer or a barrier rib material and has been extensively used for a laptop computer, a monitor, and a TV image due to lightness, thinness, low price, and low power consumption of a display, excellent adherence to an integrated circuit, and the like. However, a polybenzoxazole precursor (a polybenzoxazole polymer, PBO) may not form a pattern with high resolution due to low solubility for an alkali developing solution and lack of a large dissolution rate difference between exposed and non-exposed parts.

A photosensitizer suppressing dissolution of a resin during non-exposure and stopping the dissolution suppression during exposure may be mixed with the resin to effectively form the pattern. The mixture, however, may not be uniformly coated and can still form a non-uniform pattern during development.

Accordingly, there is a need for a resin having selectively increased solubility for an alkali developing solution in an exposed part.

SUMMARY OF THE INVENTION

One embodiment of the present invention provides a positive photosensitive resin composition that can have excellent sensitivity and/or resolution.

Another embodiment of the present invention provides a photosensitive resin film prepared using the positive photosensitive resin composition.

Yet another embodiment of the present invention provides a display device including the photosensitive resin film.

One embodiment provides a positive photosensitive resin composition including (A) a polybenzoxazole precursor including a functional group at a terminal end that is dissociated by light of about 400 nm to about 550 nm wavelength region and is acidified; (B) a photosensitive diazoquinone compound; and (C) a solvent.

The functional group may be represented by the following Chemical Formula 1:

[Chemical Formula 1]

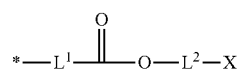

In the above Chemical Formula 1, $L^1$ and $L^2$ are the same or different and are each independently a single bond, substituted or unsubstituted C1 to C20 alkylene, substituted or unsubstituted C1 to C20 arylene, substituted or unsubstituted C1 to C20 heteroarylene, or a combination thereof, and X is substituted or unsubstituted C1 to C20 alkyl, substituted or unsubstituted C2 to C20 alkenyl, substituted or unsubstituted C2 to C20 alkynyl, substituted or unsubstituted C6 to C20 aryl, substituted or unsubstituted C1 to C20 heteroaryl, —C(O)R (wherein R is substituted or unsubstituted C1 to C20 aryl), or a combination thereof.

X may be selected from one or more of the following Chemical Formula 2 to Chemical Formula 5.

[Chemical Formula 2]

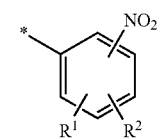

[Chemical Formula 3]

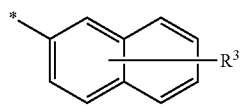

[Chemical Formula 4]

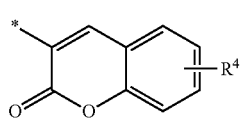

[Chemical Formula 5]

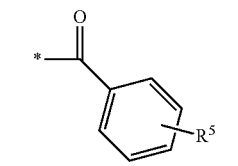

In the above Chemical Formula 2 to Chemical Formula 5, $R^1$ to $R^5$ are the same or different and are each independently hydrogen, a hydroxy group, a nitro group, substituted or unsubstituted C1 to C10 alkyl, substituted or unsubstituted C1 to C10 alkoxy, or a substituted or unsubstituted amino group.

$L^1$ may be represented by the following Chemical Formula 6:

[Chemical Formula 6]

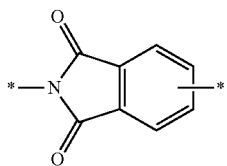

The polybenzoxazole precursor may include a structural unit represented by the following Chemical Formula 7:

[Chemical Formula 7]

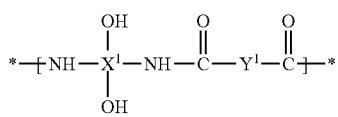

In the above Chemical Formula 7, $X^1$ is a substituted or unsubstituted C6 to C30 aromatic organic group, and $Y^1$ is a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

The positive photosensitive resin composition may further include a dissolution-controlling agent represented by the following Chemical Formula 8.

[Chemical Formula 8]

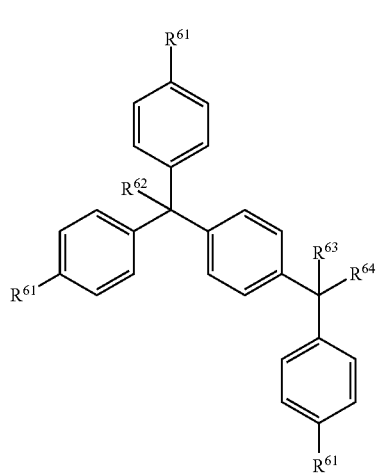

In the above Chemical Formula 8, each $R^{61}$ is the same or different and each is independently hydrogen, a hydroxy group, or substituted or unsubstituted C1 to C10 alkyl, and $R^{62}$ to $R^{64}$ are the same or different and are each independently substituted or unsubstituted C1 to C10 alkyl.

The positive photosensitive resin composition may include about 5 to about 100 parts by weight of the photosensitive diazoquinone compound (B); and about 100 to about 900 parts by weight of the solvent (C), each based on about 100 parts by weight of the polybenzoxazole precursor (A).

The positive photosensitive resin composition may further include an additive such as but not limited to a surfactant, a leveling agent, a silane coupling agent, a thermal acid generator, or a combination thereof.

Another embodiment of the present invention provides a photosensitive resin film prepared using the positive photosensitive resin composition.

Yet another embodiment of the present invention provides a display device including the photosensitive resin film.

The positive photosensitive resin composition according to one embodiment may provide a photosensitive resin film and a display device having excellent sensitivity and resolution.

DETAILED DESCRIPTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with at least one substituent including halogen (F, Cl, Br, or I), a hydroxy group, a nitro group, a cyano group, an amino group ($NH_2$, $NH(R^{200})$ or $N(R^{201})(R^{202})$, wherein $R^{200}$, $R^{201}$ and $R^{202}$ are the same or different and are independently C1 to C10 alkyl), an amidino group, a hydrazine group, a hydrazone group, a carboxyl group, substituted or unsubstituted alkyl, substituted or unsubstituted alkenyl, substituted or unsubstituted alkynyl, a substituted or unsubstituted alicyclic organic group, substituted or unsubstituted aryl, substituted or unsubstituted heterocyclic, or a combination thereof, in place of at least one hydrogen of a functional group.

As used herein, when a specific definition is not otherwise provided, the term "alkyl" refers to C1 to C20 alkyl, for example C1 to C15 alkyl, the term "cycloalkyl" refers to C3 to C20 cycloalkyl, for example C3 to C18 cycloalkyl, the term "alkoxy" refers to C1 to C20 alkoxy, for example C1 to C18 alkoxy, the term "aryl" refers to C6 to C20 aryl, for example C6 to C18 aryl, the term "alkenyl" refers to C2 to C20 alkenyl, for example C2 to C18 alkenyl, the term "alkylene" refers to C1 to C20 alkylene, for example C1 to C18 alkylene, and the term "arylene" refers to C6 to C20 arylene, for example C6 to C16 arylene.

As used herein, when a specific definition is not otherwise provided, the term "aliphatic organic group" refers to C1 to C20 alkyl, C2 to C20 alkenyl, C2 to C20 alkynyl, C1 to C20 alkylene, C2 to C20 alkenylene, or C2 to C20 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" refers to C3 to C20 cycloalkyl, C3 to C20 cycloalkenyl, C3 to C20 cycloalkynyl, C3 to C20 cycloalkylene, C3 to C20 cycloalkenylene, or C3 to C20 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, the term "aromatic organic group" refers to C6 to C20 aryl or C6 to C20 arylene, for example C6 to C16 aryl or C6 to C16 arylene, the term "heterocyclic group" refers to C2 to C20 cycloalkyl, C2 to C20 cycloalkylene, C2 to C20 cycloalkenyl, C2 to C20 cycloalkenylene, C2 to C20 cycloalkynyl, C2 to C20 cycloalkynylene, C2 to C20 heteroaryl, or C2 to C20 heteroarylene that include 1 to 3 hetero atoms including O, S, N, P, Si, or a combination thereof, in a ring, for example C2 to C15 cycloalkyl, C2 to C15 cycloalkylene, C2 to C15 cycloalkenyl, C2 to C15 cycloalkenylene, C2 to C15 cycloalkynyl, C2 to C15 cycloalkynylene, C2 to C15 heteroaryl, or C2 to C15 heteroarylene that include 1 to 3 hetero atoms including O, S, N, P, Si, or a combination thereof in a ring.

As used herein, when a specific definition is not otherwise provided, the term "combination" refers to mixing or copolymerization. The "copolymerization" refers to block copolymerization and/or random copolymerization, and the term "copolymer" refers to a block copolymer and/or a random copolymer.

As used herein, unless a specific definition is otherwise provided, a hydrogen atom is bonded at a position when a chemical bond is not drawn where a bond would otherwise appear.

Also, "*" refers to a linking part between the same or different atoms, or chemical formulae.

A positive photosensitive resin composition according to one embodiment includes (A) a polybenzoxazole precursor including a functional group at a terminal end, wherein the functional group is dissociated by light of about 400 nm to about 550 nm wavelength region and is acidified (i.e., exposes an acid terminal end of the polybenzoxazole precursor); (B) a photosensitive diazoquinone compound; and (C) a solvent.

The polybenzoxazole precursor includes a functional group at a terminal end. The functional group is dissociated when exposed to light, for example the light of an i-line region, and exposes an acid terminal end of the polybenzoxazole precursor. Thus the composition including polybenzoxazole precursor can be dissolved at a higher rate in an alkali developing solution. The functional group of the polybenzoxazole precursor, however, suppresses dissolution in the alkali developing solution prior to exposure to light, since the functional group is not dissociated but maintained in a non-exposed part. As a result the photosensitive resin film can have improved sensitivity and/or resolution.

Hereinafter, each component is described in detail.

(A) Polybenzoxazole Precursor

A positive photosensitive resin composition according to one embodiment includes a pholybenzoxazole precursor having a functional group dissociated by light at the terminal end. The pholybenzoxazole precursor can improve sensitivity and/or resolution of a photosensitive resin film.

The functional group absorbs light in a wavelength region ranging from about 400 nm to about 550 nm, for example, in an i-line region and thus, is dissociated. In general, the polybenzoxazole precursor has an acid terminal end (e.g., a carboxyl group and the like), but according to one embodiment, the terminal end is protected by the functional group and blocks the polybenzoxazole precursor from being dissolved in an alkali developing solution, for example, in tetramethylammonium hydroxide (TMAH) and the like. However, when the polybenzoxazole precursor absorbs light in a wavelength region of about 400 nm to about 550 nm, that is, is exposed to light, the functional group is dissociated and exposes the acid terminal end again and thus, is well dissolved in the alkali developing solution. Accordingly, one embodiment of the present invention may decrease sensitivity but increase resolution during pattern formation by selectively exposing the acid terminal end in an exposed part and thus, increasing a solubility difference of the polybenzoxazole precursor for an alkali developing solution between the exposed and non-exposed parts.

The functional group may be represented by the following Chemical Formula 1.

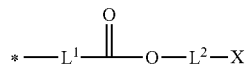

[Chemical Formula 1]

In the above Chemical Formula 1, $L^1$ and $L^2$ are the same or different and are each independently a single bond, substituted or unsubstituted C1 to C20 alkylene, substituted or unsubstituted C1 to C20 arylene, substituted or unsubstituted C1 to C20 heteroarylene, or a combination thereof, X is substituted or unsubstituted C1 to C20 alkyl, substituted or unsubstituted C2 to C20 alkenyl, substituted or unsubstituted C2 to C20 alkynyl, substituted or unsubstituted C6 to C20 aryl, substituted or unsubstituted C1 to C20 heteroaryl, —C(O)R (wherein R is substituted or unsubstituted C1 to C20 aryl), or a combination thereof.

The —C(O)R indicates that R is bonded with a ketone group, and the R may be, for example, substituted or unsubstituted phenyl.

X may be selected from one or more of the following Chemical Formula 2 to Chemical Formula 5.

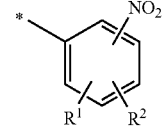

[Chemical Formula 2]

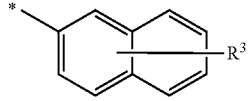

[Chemical Formula 3]

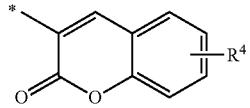

[Chemical Formula 4]

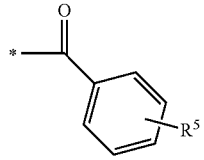

[Chemical Formula 5]

In the above Chemical Formulas 2 to 5, $R^1$ to $R^5$ are the same or different and are each independently hydrogen, a hydroxy group, a nitro group, substituted or unsubstituted C1 to C10 alkyl, substituted or unsubstituted C1 to C10 alkoxy, or a substituted or unsubstituted amino group.

The substituted amino group may be, for example an amino group substituted with C1 to C10 alkyl, as another example an amino group substituted with methyl and/or ethyl.

$L^1$ may be represented by the following Chemical Formula 6.

[Chemical Formula 6]

The polybenzoxazole precursor may include a structural unit represented by the following Chemical Formula 7.

[Chemical Formula 7]

$$*\!-\!\!\left[\!\!\begin{array}{c}\text{OH}\\|\\\text{NH}\!-\!\text{X}^1\!-\!\text{NH}\!-\!\overset{\text{O}}{\underset{\|}{\text{C}}}\!-\!\text{Y}^1\!-\!\overset{\text{O}}{\underset{\|}{\text{C}}}\\|\\\text{OH}\end{array}\!\!\right]\!\!-\!*$$

In the above Chemical Formula 7, each $X^1$ is the same or different and each is independently a substituted or unsubstituted C6 to C30 aromatic organic group, and each $Y^1$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

$X^1$ may be an aromatic organic group and may be a residual group derived from aromatic diamine.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl)hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl)hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl)hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl)hexafluoropropane, 2-(3-amino-4-hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-amino-2-trifluoromethylphenyl)hexafluoropropane, 2-(3-amino-4-hydroxy-2-trifluoromethylphenyl)-2-(3-hydroxy-4-amino-5-trifluoromethylphenyl)hexafluoropropane, 2-(3-amino-4-hydroxy-6-trifluoromethylphenyl)-2-(3-hydroxy-4-amino-5-trifluoromethylphenyl)hexafluoropropane, and the like, and combinations thereof.

Examples of $X^1$ may include a functional group represented by one or more of the following Chemical Formula 50 and Chemical Formula 51, but are not limited thereto.

[Chemical Formula 50]

[Chemical Formula 51]

In the above Chemical Formulae 50 and 51, $A^1$ is a single bond, O, CO, $CR^{47}R^{48}$, $SO_2$, or S, wherein $R^{47}$ and $R^{48}$ are the same or different and are each independently hydrogen or substituted or unsubstituted C1 to C30 alkyl, for example a C1 to C30 fluoroalkyl group, $R^{50}$ to $R^{52}$ are the same or different and are each independently hydrogen, substituted or unsubstituted C1 to C30 alkyl, a substituted or unsubstituted C1 to C30 carboxyl group, a hydroxy group, or a thiol group, n10 is an integer of 0 to 2, and n11 and n12 are the same or different and are each independently integers of 0 to 3.

$Y^1$ may be an aromatic organic group, a divalent to hexavalent aliphatic organic group, or a divalent to hexavalent alicyclic organic group, and may be a residual group of dicarboxylic acid or a residual group of a dicarboxylic acid derivative. Specifically, $Y^1$ may be an aromatic organic group or a divalent to hexavalent alicyclic organic group.

Examples of the dicarboxylic acid derivative may include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole, and the like, and combinations thereof.

Examples of $Y^1$ may include a functional group represented by one or more of the following Chemical Formulae 52 to 54, but are not limited thereto.

[Chemical Formula 52]

[Chemical Formula 53]

[Chemical Formula 54]

In the above Chemical Formulae 52 to 54, $R^{53}$ to $R^{56}$ are the same or different and are each independently hydrogen or substituted or unsubstituted C1 to C30 alkyl, n13 and n14 are the same or different and are each independently integers of 0 to 4, and n15 and n16 are the same or different and are each independently integers of 0 to 3, $A^2$ is a single bond, O, $CR^{47}R^{48}$, CO, CONH, S, or $SO_2$, wherein $R^{47}$ and $R^{48}$ are the same or different and are each independently hydrogen or substituted or unsubstituted C1 to C30 alkyl, for example a C1 to C30 fluoroalkyl group.

The polybenzoxazole precursor may have a weight average molecular weight (Mw) of about 3,000 g/mol to about 300,000 g/mol. When the polybenzoxazole precursor has a weight average molecular weight within the above range, sufficient properties may be obtained, and it may be easy to handle due to good dissolution in an organic solvent.

(B) Photosensitive Diazoquinone Compound

The photosensitive diazoquinone compound may be a compound having a 1,2-benzoquinone diazide structure and/or a 1,2-naphtoquinone diazide structure.

The photosensitive diazoquinone compound may include at least one or more compounds represented by the following Chemical Formulae 17 and 19 to 21, but is not limited thereto.

[Chemical Formula 17]

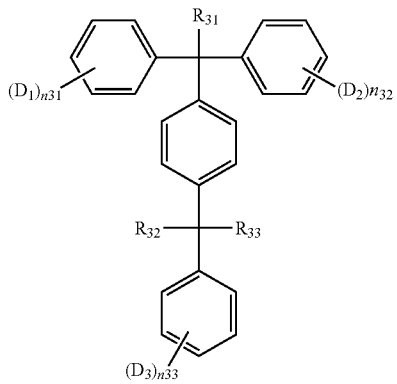

In the above Chemical Formula 17, $R_{31}$ to $R_{33}$ are the same or different and are each independently hydrogen or substituted or unsubstituted alkyl, for example $CH_3$, $D_1$ to $D_3$ are the same or different and are each independently OQ, wherein the Q is hydrogen or the following Chemical Formula 18a or 18b, provided that all Qs are not simultaneously hydrogen, and n31 to n33 are the same or different and are each independently integers of 1 to 3.

[Chemical Formula 18a]

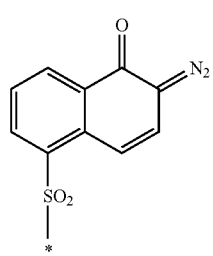

[Chemical Formula 18b]

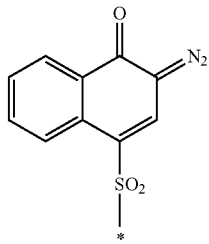

[Chemical Formula 19]

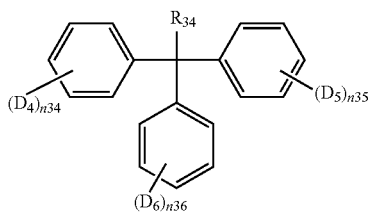

In the above Chemical Formula 19, $R_{34}$ is hydrogen or substituted or unsubstituted alkyl, $D_4$ to $D_6$ are OQ, wherein the Q is the same as defined in the above Chemical Formula 17, and n34 to n36 are the same or different and are each independently integers of 1 to 3.

[Chemical Formula 20]

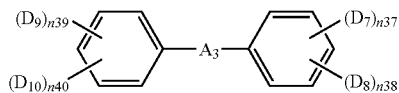

In the above Chemical Formula 20, $A_3$ is CO or CR'R", wherein R' and R" are the same or different and are each independently substituted or unsubstituted alkyl, $D_7$ to $D_{10}$ are the same or different and are each independently hydrogen, substituted or unsubstituted alkyl, OQ, or NHQ, wherein the Q is the same as defined in the above Chemical Formula 17, n37, n38, n39 and n40 are the same or different and are each independently integers of 1 to 4, n37+n38 and n39+n40 are the same or different and are each independently integers of less than or equal to 5, and at least one of the $D_7$ to $D_{10}$ is OQ, and one aromatic ring includes one to three OQs and the other aromatic ring includes one to four OQs.

[Chemical Formula 21]

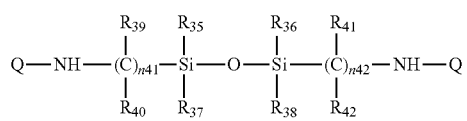

In the above Chemical Formula 21, $R_{35}$ to $R_{42}$ are the same or different and are each independently hydrogen or substituted or unsubstituted alkyl, n41 and n42 are the same or different and are each independently integers of 1 to 5, for example 2 to 4, Q is the same as defined in the above Chemical Formula 17.

The positive photosensitive resin composition may include the photosensitive diazoquinone compound in an amount of about 5 parts by weight to about 100 parts by weight based on about 100 parts by weight of the polybenzoxazole precursor (A). In some embodiments, the positive photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the photosensitive diazoquinone compound can be in a range from about any of the foregoing amounts to about any other of the foregoing amounts.

When the photosensitive diazoquinone compound is included in an amount within the above range, the pattern can be well-formed with minimal or no residue from exposure, and film thickness loss during development may be prevented and thereby a good pattern can be provided.

(C) Solvent

The positive photosensitive resin composition may include a solvent that is capable of easily dissolving each component.

The solvent improves film uniformity during coating and prevents coating and pin stains and thus, forms a uniform pattern.

Examples of the solvent may include without limitation alcohols such as methanol, ethanol, benzylalcohol, hexylalcohol and the like; ethylene glycolalkyletheracetates such as ethylene glycolmethyletheracetate, ethylene glycol ethyletheracetate, and the like; ethylene glycol alkyl ether propionates such as ethylene glycolmethyletherpropionate, ethylene glycolethyletherpropionate, and the like; ethylene glycolmonoalkylethers such as ethylene glycolmethylether, ethylene glycolethylether, and the like; diethylene glycolalkylethers such as diethylene glycolmonomethylether, diethylene glycol monoethylether, diethylene glycol dimethylether, diethylene glycolmethylethylether, and the like; propylene glycolalkyletheracetates such as propylene glycol methylether acetate, propylene glycolethyletheracetate, propylene glycolpropyletheracetate, and the like; propylene glycolalkyletherpropionates such as propylene glycolmethyletherpropionate, propylene glycolethyletherpropionate, propylene glycolpropyletherpropionate, and the like; propylene glycolmonoalkylethers such as propylene glycolmethylether, propylene glycolethylether, propylene glycolpropylether, propylene glycolbutylether, and the like; dipropylene glycolalkylethers such as dipropylene glycoldimethylether, dipropylene glycoldiethylether, and the like; butylene glycolmonomethylethers such as butylene glycolmonomethylether, butylene glycolmonoethylether, and the like; dibutylene glycolalkylethers such as dibutylene glycoldimethylether, dibutylene glycoldiethylether, and the like. The solvent may be used singularly or as a mixture of two or more.

The solvent may be selected appropriately depending on a process of forming a photosensitive resin film such as spin coating, slit die coating, and the like.

The positive photosensitive resin composition may include the solvent in an amount of about 200 parts by weight to about 900 parts by weight based on about 100 parts by weight of the polybenzoxazole precursor (A).

When the positive photosensitive resin composition includes the solvent in an amount within the above range, a sufficiently thick film may be obtained, and good solubility and coating properties may be provided.

(D) Dissolution-Controlling Agent

The positive photosensitive resin composition according to one embodiment may further include a dissolution-controlling agent.

The dissolution-controlling agent may in general include a phenol compound.

The phenol compound can increase dissolution rate and sensitivity of an exposed part during development using an alkali aqueous solution and can promote patterning with high resolution.

Examples of such a phenol compound may include without limitation 2,6-dimethoxymethyl-4-t-butylphenol, 2,6-dimethoxymethyl-p-cresol, 2,6-diacetoxymethyl-p-cresol, and the like, and combinations thereof.

For example, the dissolution-controlling agent may be represented by the following Chemical Formula 8.

[Chemical Formula 8]

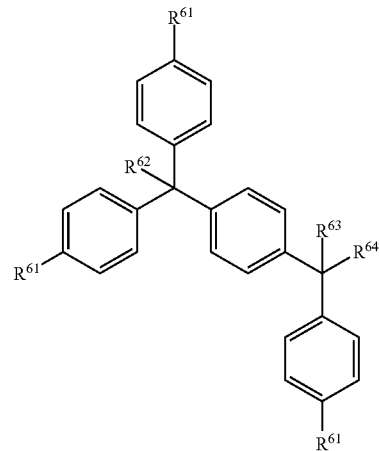

In the above Chemical Formula 8, each $R^{61}$ is independently hydrogen, a hydroxy group, or substituted or unsubstituted C1 to C10 alkyl, and $R^{62}$ to $R^{64}$ are the same or different and are each independently substituted or unsubstituted C1 to C10 alkyl.

When the compound represented by the above Chemical Formula 8 is included as a dissolution-controlling agent, dissolution rate and sensitivity of an exposed part during development may be improved, and since a development residue may not be produced, developability of the exposed part may also be improved.

The positive photosensitive resin composition may include the dissolution-controlling agent in an amount of about 1 part by weight to about 30 parts by weight based on about 100 parts by weight of the polybenzoxazole precursor. In some embodiments, the positive photosensitive resin composition may include the dissolution-controlling agent in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the dissolution-controlling agent can be in a range from about any of the foregoing amounts to about any other of the foregoing amounts.

When the dissolution-controlling agent is included in an amount within the above range, a satisfactory pattern may be obtained by not deteriorating sensitivity but appropriately increasing dissolution rate of a non-exposed part during development, and excellent storage stability can also be obtained, since not extracted during storage in a freezer.

(E) Other Additives

The positive photosensitive resin composition according to one embodiment may further include one or more other additives.

The other additives may include without limitation a thermal acid generator, a surfactant, a leveling agent, a silane coupling agent, and the like, and combinations thereof.

Examples of the thermal acid generator may include without limitation arylsulfonic acids such as p-toluenesulfonic acid, benzenesulfonic acid, and the like; perfluoroalkylsulfonic acids such as trifluoromethanesulfonic acid, trifluorobutanesulfonic acid, and the like; alkylsulfonic acids such as methanesulfonic acid, ethanesulfonic acid, butanesulfonic acid, and the like; and combinations thereof.

The thermal acid generator is a catalyst for a dehydration reaction and a cyclization reaction of polyamide including a phenolic hydroxy group of the polybenzoxazole precursor, and thus a cyclization reaction may be performed smoothly even if a curing temperature is decreased to about 300° C.

In addition, an additive such as a suitable surfactant and/or leveling agent may be included in order to prevent a stain of the film and/or to improve the development. In addition, a silane coupling agent may be used as an adherence enhancer to increase adherence to a substrate.

The thermal acid generator, surfactant, leveling agent, and/or silane coupling agent may be used singularly or as a mixture.

When the positive photosensitive resin composition according to the embodiment is used to form a pattern, a process of forming the pattern includes coating the positive photosensitive resin composition on a supportive substrate in a method of spin coating, slit coating, inkjet printing, and the like; drying the coated positive photosensitive resin composition to form a positive photosensitive resin composition layer; exposing the positive photosensitive resin composition layer; developing the exposed positive photosensitive resin composition layer in an alkali aqueous solution to manufacture a photosensitive resin film; and heat-treating the photosensitive resin film. The patterning process is performed under conditions well-known in a related art, and the conditions will not be illustrated in detail here.

According to another embodiment, a photosensitive resin film prepared using the positive photosensitive resin composition is provided.

The photosensitive resin film may be, for example an organic insulation layer, a buffer layer, or a protective layer.

According to yet another embodiment of the present invention, a display device including the photosensitive resin film is provided.

Specifically, the display device may be an organic light emitting diode (OLED) or a liquid crystal display (LCD).

In other words, the positive photosensitive resin composition according to one embodiment of the present invention may be usefully applied to form an organic insulation layer, a planarization layer, a passivation layer, or an interlayer insulation layer in a display device.

Hereinafter, the present invention is illustrated in more detail with reference to the following examples and comparative examples. However, the following examples and comparative examples are provided for the purpose of descriptions and the present invention is not limited thereto.

EXAMPLES

Synthesis of Polybenzoxazole Precursor

Preparation Example 1

10 g of trimellitic anhydride (TA) and 11.2 g of o-nitrobenzyl bromide (NBB) are dissolved in 50 g of N-methyl-2-pyrrolidone (NMP) in a 4-necked flask having an agitator, a temperature controller, a nitrogen gas injector, and a cooler while nitrogen is passed through the flask, 8.2 g of pyridine as a catalyst is added thereto, and the mixture is blocked from ultraviolet (UV) and reacted at room temperature. After 24 hours, the reaction mixture is purified by using a glass filter. Then, 310 g of a solution obtained by dissolving 49 g of 2,2'-bis(3-amino-4-hydroxyphenyl)hexafluoropropane (Bis-APAF) and 19 g of pyridine in N-methyl-2-pyrrolidone (NMP) is added to the purified solution, and the mixture is agitated at 80° C. for 3 hours. The reactant is cooled down to 3° C., and a solution obtained by dissolving 32 g of 4,4'-dioxybenzoylchloride in 80 g of N-methyl-2-pyrrolidone (NMP) is slowly added thereto for 30 minutes. After the addition, the mixture is agitated at 3° C. for 12 hours, completing the reaction. The reaction mixture is put in water to produce a precipitate, the precipitate is filtered and sufficiently washed with an excessive amount of water, and dried at 80° C. under vacuum for greater than or equal to 24 hours, obtaining 60 g of a compound represented by the following Chemical Formula A, a polybenzoxazole precursor at the terminal end of ortho-nitrobenzyl carbonate. The weight average molecular weight of the polymer reduced to standard polystyrene by a GPC method is 7,100 g/mol, and polydispersity of the polymer is 1.50.

[Chemical Formula A]

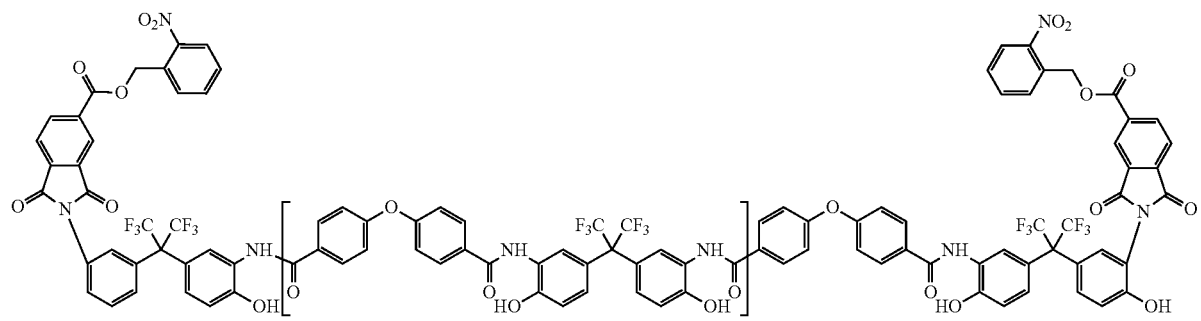

Preparation Example 2

A polybenzoxazole precursor represented by the following Chemical Formula B is obtained according to the same method as Preparation Example 1 except for adding 14.4 g of 4,5-dimethoxy-2-nitrobenzyl bromide (DMNBB) instead of 11.2 g of o-nitrobenzyl bromide (NBB) in Preparation Example 1. The weight average molecular weight of the polymer reduced to standard polystyrene by a GPC method is 7,300 g/mol, and polydispersity of the polymer is 1.64.

[Chemical Formula B]

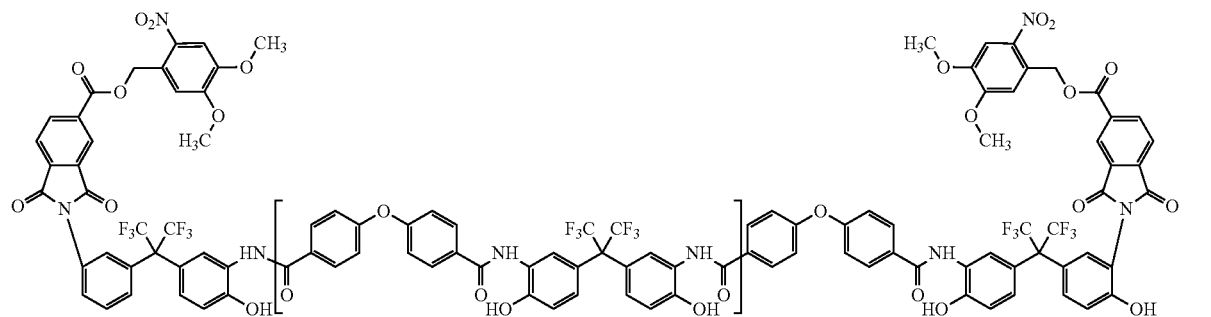

Preparation Example 3

A polybenzoxazole precursor represented by the following Chemical Formula C is obtained according to the same method as Preparation Example 1 except for adding 10.7 g of 4p-hydroxyphenacyl bromide instead of 11.2 g of o-nitrobenzyl bromide (NBB) in Preparation Example 1. The weight average molecular weight of the polymer obtained reduced to standard polystyrene by a GPC method is 7,100 g/mol, and polydispersity of the polymer is 1.62.

temperature controller, a nitrogen gas injector, and a cooler while nitrogen is passed through the flask, 10.3 g of N,N'-dicyclodexylcarbodiimide (DCC) and 6.1 g of 4-dimethylaminopyridine (DMAP) are added thereto, and the mixture is blocked from ultraviolet (UV) and reacted at room temperature. After 24 hours later, the reaction mixture is purified by using a glass filter. Then, a solution obtained by dissolving 49 g of 2,2'-bis(3-amino-4-hydroxyphenyl)hexafluoropropane (Bis-APAF) and 19 g of pyridine 310 g of N-methyl-2-pyrrolidone (NMP) is added to the solution, and the mixture is agitated at 80° C. for 3 hours. The reactant is cooled down to 3° C., and a solution obtained by dissolving 32 g of 4,4'-dioxybenzoylchloride in 80 g of N-methyl-2-pyrrolidone (NMP) is slowly added thereto for 30 minutes in a dropwise fashion. After addition, the mixture is agitated for 12 hours at 3° C., completing the reaction. The reaction mixture is put in water to produce a precipitate, the precipitate is filtered and sufficiently washed with an excessive amount water and then, dried at 80° C. under vacuum for greater than or equal to 24 hours, obtaining a compound represented by the following Chemical Formula D, a polybenzoxazole precursor. The weight average molecular weight of the polymer reduced to standard polystyrene by a GPC method is 6,950 g/mol, and polydispersity of the polymer is 1.62.

[Chemical Formula C]

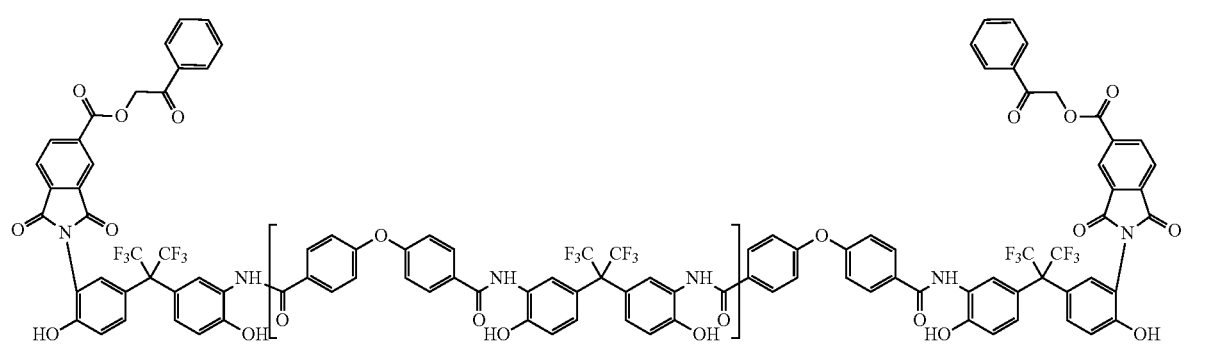

Preparation Example 4

10 g of trimellitic anhydride (TA) and 10.2 g of 3-nitro-naphthalenemethanol are dissolved in 50 g of N-methyl-2-pyrrolidone (NMP) in a 4-necked flask having an agitator, a

[Chemical Formula D]

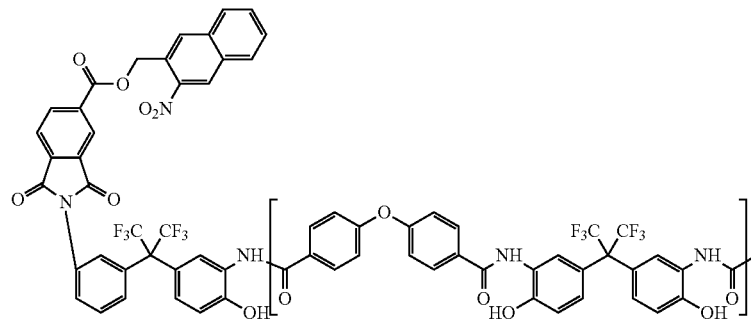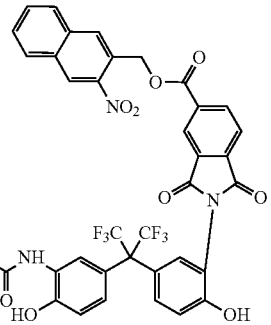

Preparation Example 5

A polybenzoxazole precursor represented by the following Chemical Formula E is obtained according to the same method as Preparation Example 4 except for using 8.7 g of 3-hydroxyl-2-naphthalenemethanol instead of 10.2 g of the 3-nitro-naphthalenemethanol. The weight average molecular weight of the polymer reduced to standard polystyrene by a GPC method is 7,250 g/mol, and polydispersity of the polymer is 1.40.

[Chemical Formula E]

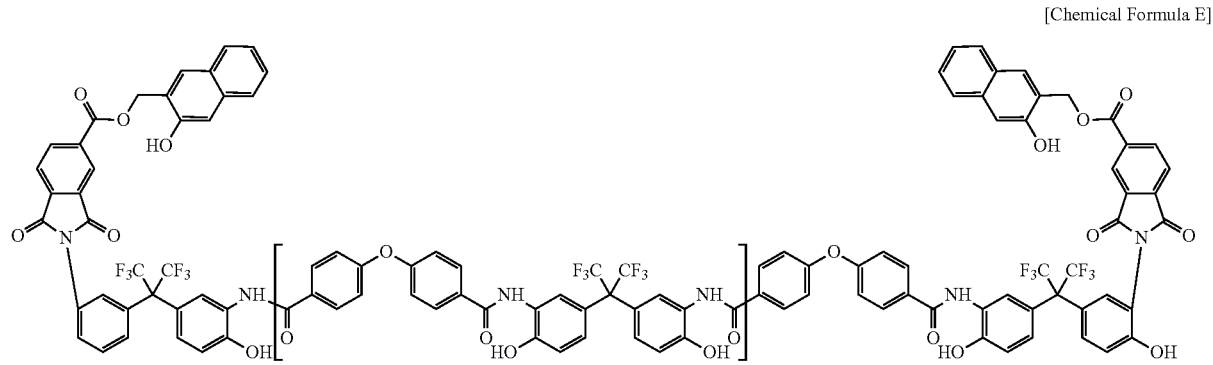

Preparation Example 6

A polybenzoxazole precursor represented by the following Chemical Formula F is polymerized according to the same method as Preparation Example 4 except for using 13.6 g of 3',5'-diemthoxybenzoin instead of 10.2 g of the 3-nitro-naphthalenemethanol. The weight average molecular weight of the polymer reduced to standard polystyrene by a GPC method is 6,930 g/mol, and polydispersity of the polymer is 1.55.

[Chemical Formula F]

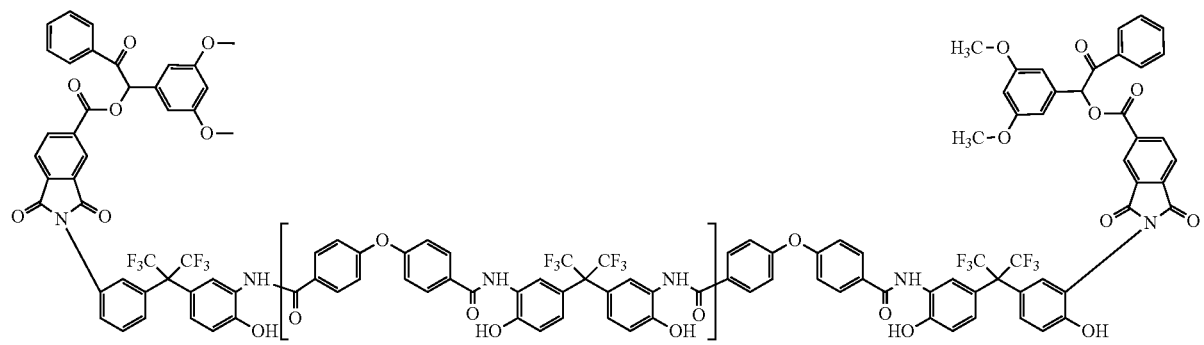

Preparation Example 7

A polybenzoxazole precursor represented by the following Chemical Formula G is polymerized according to the same method as Preparation Example 4 except for using 12.4 g of 7-N,N'-diethylamino-4-hydroxymethylcoumarin instead of 10.2 g of the 3-nitro-naphthalenemethanol. The weight average molecular weight of the polymer reduced to standard polystyrene by a GPC method is 6,870 g/mol, and polydispersity of the polymer is 1.64.

[Chemical Formula G]

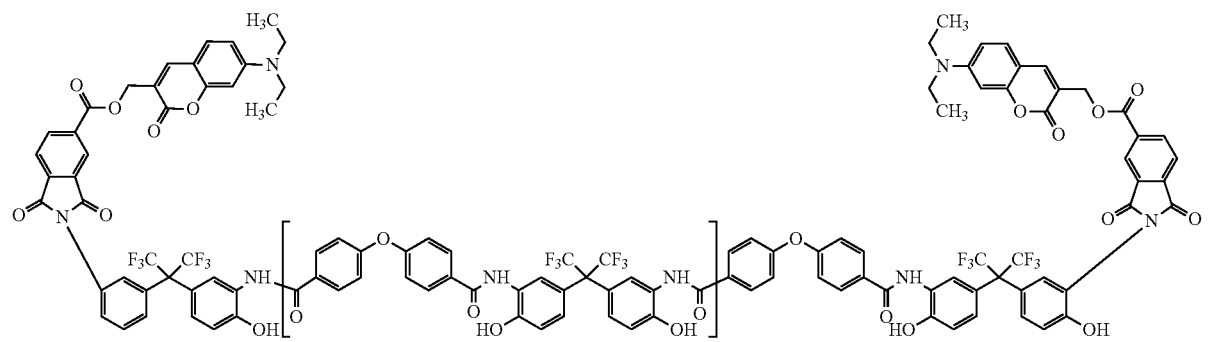

Preparation Example 8

A polybenzoxazole precursor represented by the following Chemical Formula H is polymerized according to the same method as Preparation Example 4 except for using 9.1 g of 2-(dimethylamino)-5-nitrophenol instead of 10.2 g of the 3-nitro-naphthalenemethanol. The weight average molecular weight of the polymer reduced to standard polystyrene by a GPC method is 6,870 g/mol, and polydispersity of the polymer is 1.74.

Comparison Preparation Example 1

10 g of trimellitic anhydride (TA) and 8.2 g of 2-naphthalenemethanol are dissolved in 50 g of N-methyl-2-pyrrolidone (NMP) in a 4-necked flask having an agitator, a temperature controller, a nitrogen gas injector, and a cooler while nitrogen is passed through the flask, 10.3 g of N,N'-dicyclodexylcarbodiimide (DCC) and 6.1 g of 4-dimethylaminopyridine (DMAP) are added thereto, and the mixture is blocked from ultraviolet (UV) and reacted at room temperature. After 24 hours later, the reaction mixture is purified through a glass filter. Then, a solution obtained by dissolving 49 g of 2,2'-bis(3-amino-4-hydroxyphenyl)hexafluoropropane (Bis-APAF) and 19 g of pyridine in 310 g of N-methyl-2-pyrrolidone (NMP) is added to the purified solution, and the mixture is agitated at 80° C. for 3 hours. The reactant is cooled down to 3° C., and a solution obtained by dissolving 32 g of 4,4'-dioxybenzoylchloride in 80 g of N-methyl-2-pyrrolidone (NMP) is slowly added thereto in a dropwise fashion for 30 minutes. After the addition, the mixture is agitated at 3° C. for 12 hours, completing the reaction. The reaction mixture is put in water to produce a precipitate, and the precipitate is filtered, sufficiently washed with water in an excessive amount, and dried at 80° C. under vacuum for greater than or equal to 24 hours, obtaining a compound represented by the following Chemical Formula W, a polybenzoxazole precursor. The weight average molecular weight of the polymer reduced to standard polystyrene by a GPC method is 7,250 g/mol, and polydispersity of the polymer is 1.73.

[Chemical Formula H]

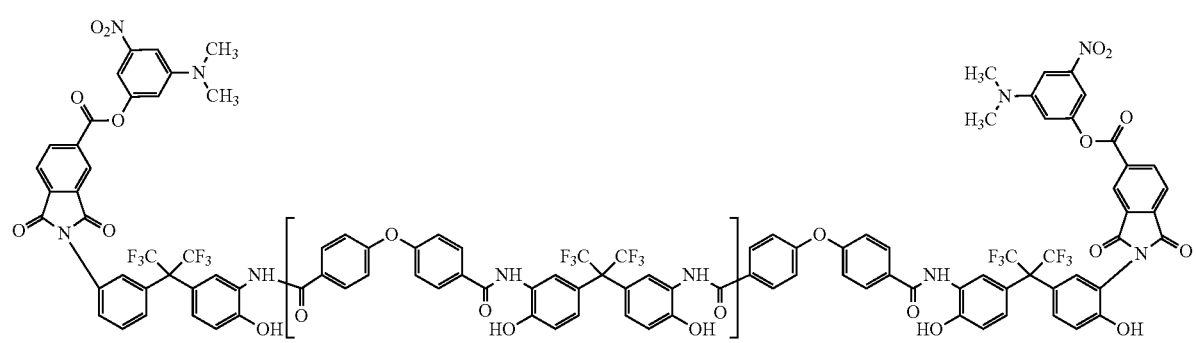

[Chemical Formula W]

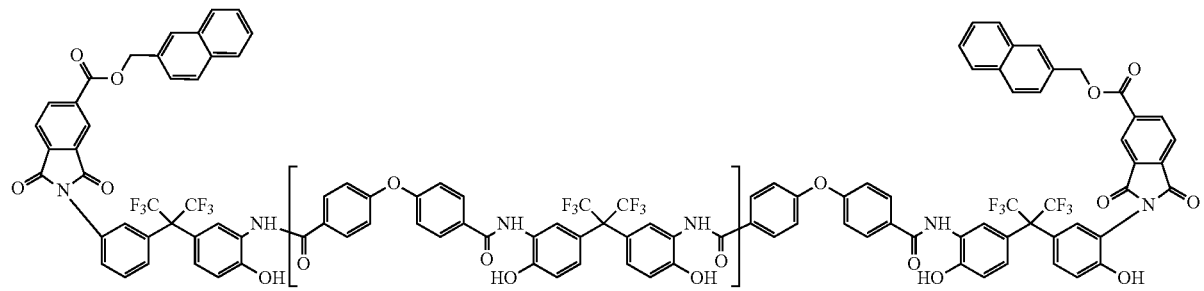

Comparison Preparation Example 2

49 g of 2,2'-bis(3-amino-4-hydroxyphenyl)hexafluoropropane (Bis-APAF) and 7.7 g of trimellitic anhydride (TA) are dissolved in 610 g of N-methyl-2-pyrrolidone (NMP) in a 4-necked flask having an agitator, a temperature controller, a nitrogen gas injector, and a cooler while nitrogen is passed through the flask.

When the solids are completely dissolved, 18 g of pyridine is added thereto, and the mixture is heated up to 80° C. and then, agitated for 3 hours. The reactant is cooled down to 0° C. to 5° C., and a solution obtained by dissolving 36.5 g of 4,4'-dioxybenzoylchloride in 123 g of N-methyl-2-pyrrolidone (NMP) is slowly added thereto in a dropwise fashion for 30 minutes. After the addition, the mixture is reacted at 0° C. to 5° C. for 12 hours, completing the reaction. The reaction mixture is put in 2 L of water to produce a precipitate, and the precipitate is filtered, sufficiently washed with water, and dried at 80° C. for 24 hours under vacuum, obtaining a polybenzoxazole precursor represented by the following Chemical Formula X. The weight average molecular weight of the polymer reduced to standard polystyrene by a GPC method is 7,030 g/mol, and polydispersity of the polymer is 1.56.

[Chemical Formula X]

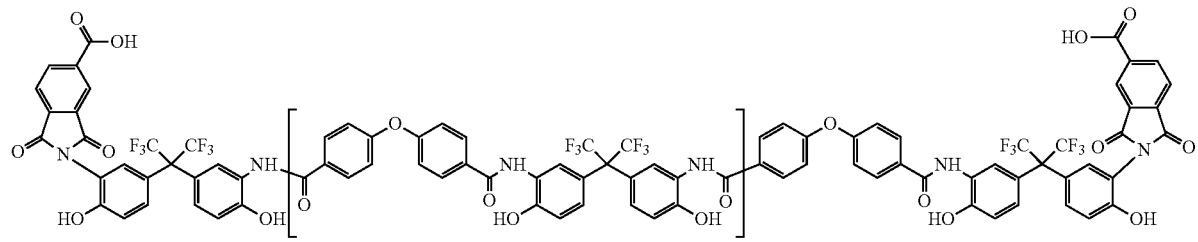

Comparison Preparation Example 3

43.9 g of 2,2'-bis(3-amino-4-hydroxyphenyl)hexafluoropropane (Bis-APAF) and 8.3 g of 5-norbornene-2,3-dicarboxylic acidanhydride are dissolved in 610 g of N-methyl-2-pyrrolidone (NMP) in a 4-necked flask having an agitator, a temperature controller, a nitrogen gas injector, and a cooler while nitrogen is passed through the flask.

When the solids are completely dissolved, 18 g of pyridine is added thereto, and the mixture is heated up to 80° C. and agitated for 3 hours. Then, the reactant is cooled down to 0° C. to 5° C., and a solution obtained by dissolving 30.6 g of 4,4'-dioxybenzoylchloride in 123 g of N-methyl-2-pyrrolidone (NMP) is slowly added thereto in a dropwise fashion for 30 minutes. After the addition, the mixture is reacted at 0° C. to 5° C. for 12 hours, completing the reaction. The reaction mixture is put in 2 L of water to produce a precipitate, and the precipitate is filtered, sufficiently washed with water, and dried at 80° C. for greater than or equal to 24 hours, obtaining a polybenzoxazole precursor represented by the following Chemical Formula Y. The weight average molecular weight of the polymer reduced to standard polystyrene by a GPC method is 6,500 g/mol, and polydispersity of the polymer is 1.75.

[Chemical Formula Y]

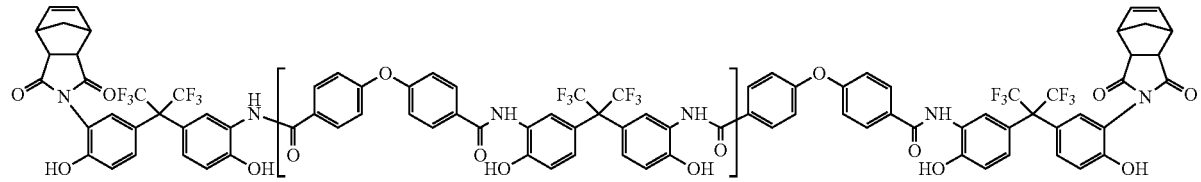

Comparison Preparation Example 4

43.9 g of 2,2'-bis(3-amino-4-hydroxyphenyl)hexafluoropropane (Bis-APAF) is dissolved in 610 g of N-methyl-2-pyrrolidone (NMP) in a 4-necked flask having an agitator, a temperature controller, a nitrogen gas injector, and a cooler while nitrogen is passed through the flask.

When the solids are completely dissolved, 18 g of pyridine is added thereto, and the mixture is heated up to 80° C. and agitated for 3 hours. Then, the reactant is cooled down to 0° C. to 5° C., and a solution obtained by dissolving 30.6 g of 4,4'-dioxybenzoylchloride in 123 g of N-methyl-2-pyrrolidone (NMR) is slowly added thereto in a dropwise fashion for 30 minutes. After the addition, the mixture is reacted at 0° C. to 5° C. for 12 hours, completing the reaction. The reaction mixture is put in 2 L of water to produce a precipitate, and the precipitate is filtered, sufficiently washed with water, and dried at 80° C. under vacuum for 24 hours, obtaining a polybenzoxazole precursor represented by the following Chemical Formula Z. The weight average molecular weight of the polymer to standard polystyrene by a GPC method is 6,850 g/mol, and polydispersity of the polymer is 1.84.

filtered with a 0.45 μm fluororesin filter, obtaining a positive photosensitive resin composition.

[Chemical Formula 60]

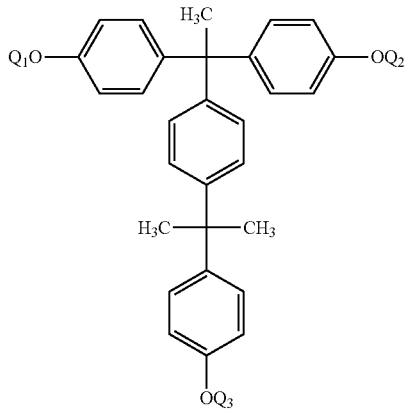

In the above Chemical Formula, two out of Q1 to Q3 is represented as

[Chemical Formula Z]

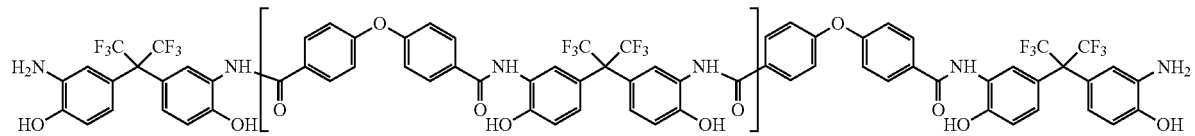

Preparation of Positive Photosensitive Resin Composition

Example 1

15 g of a polybenzoxazole (PBO) precursor represented by Chemical Formula A is added to 80 g of a three component solvent of propylene glycol monomethyl ether (PGME)/ethyl lactate (EL)/gamma butyrolactone (γ-GBL) and dissolved therein, and 3 g of photosensitive diazoquinone represented by Chemical Formula 60, 2 g of a dissolution-controlling agent represented by Chemical Formula 70, and 0.05 g of a surfactant F-554 are added thereto and sufficiently dissolved therein at room temperature. Subsequently, the solution is

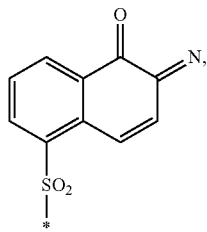

and the other one is hydrogen atom.

[Chemical Formula 70]

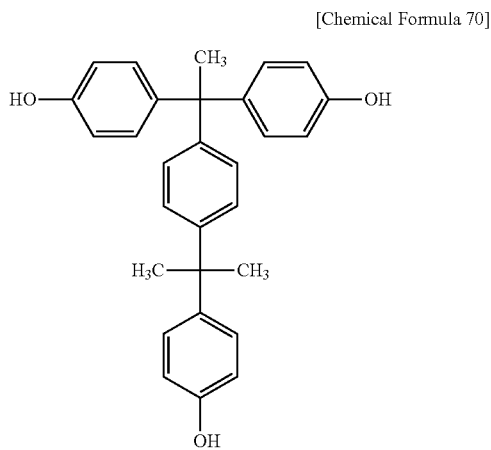 [SMILES: CC(C)(c1ccc(O)cc1)c1ccc(C(C)(c2ccc(O)cc2)c2ccc(O)cc2)cc1]

Example 2

A positive photosensitive resin composition is prepared according to the same method as Example 1 except for using a polybenzoxazole precursor represented by Chemical Formula B instead of the polybenzoxazole precursor represented by Chemical Formula A.

Example 3

A positive photosensitive resin composition is prepared according to the same method as Example 1 except for using a polybenzoxazole precursor represented by Chemical Formula C instead of the polybenzoxazole precursor represented by Chemical Formula A.

Example 4

A positive photosensitive resin composition is prepared according to the same method as Example 1 except for using a polybenzoxazole precursor represented by Chemical Formula D instead of the polybenzoxazole precursor represented by Chemical Formula A.

Example 5

A positive photosensitive resin composition is prepared according to the same method as Example 1 except for using a polybenzoxazole precursor represented by Chemical Formula E instead of the polybenzoxazole precursor represented by Chemical Formula A.

Example 6

A positive photosensitive resin composition is prepared according to the same method as Example 1 except for using a polybenzoxazole precursor represented by Chemical Formula F instead of the polybenzoxazole precursor represented by Chemical Formula A.

Example 7

A positive photosensitive resin composition is prepared according to the same method as Example 1 except for using a polybenzoxazole precursor represented by Chemical Formula G instead of the polybenzoxazole precursor represented by Chemical Formula A.

Example 8

A positive photosensitive resin composition is prepared according to the same method as Example 1 except for using a polybenzoxazole precursor represented by Chemical Formula H instead of the polybenzoxazole precursor represented by Chemical Formula A.

Comparative Example 1

A positive photosensitive resin composition is prepared according to the same method as Example 1 except for using a polybenzoxazole precursor represented by Chemical Formula W and prepared in Comparison Preparation Example 1 instead of the polybenzoxazole precursor represented by Chemical Formula A.

Comparative Example 2

A positive photosensitive resin composition is prepared according to the same method as Example 1 except for using a polybenzoxazole precursor represented by Chemical Formula X and prepared in Comparison Preparation Example 2 instead of the polybenzoxazole precursor represented by Chemical Formula A.

Comparative Example 3

A positive photosensitive resin composition is prepared according to the same method as Example 1 except for using a polybenzoxazole precursor represented by Chemical Formula Y and prepared in Comparison Preparation Example 3 instead of the polybenzoxazole precursor represented by Chemical Formula A.

Comparative Example 4

A positive photosensitive resin composition is prepared according to the same method as Example 1 except for using a polybenzoxazole precursor represented by Chemical Formula Z and prepared in Comparison Preparation Example 4 instead of the polybenzoxazole precursor represented by Chemical Formula A.

Evaluation (1) Solubility Evaluation of Tetramethylammonium Hydroxide (TMAH)

3 g of the synthesized polybenzoxazole precursor is added to 12 g of a solution (PGME/EL/GBL=7/2/1), preparing a solution including 20% of a solid. The obtained solution is coated on two sheets of 4-inch wafers by using a spin-coater and baked at 120° C. for 100 seconds to be 2 μm thick. One of these wafers is exposed. This coated sample is cut into a size of 2 cm×2 cm and put in a 2.38 wt % TMAH solution at 23° C., and then, its dissolution speed is measured. The results are provided in the following Table 1.

TABLE 1

| | Dissolution rate (A/s) | |
| --- | --- | --- |
| | Before exposure | After exposure |
| Example 1 | 280 | 3500 |
| Example 2 | 300 | 3800 |
| Example 3 | 310 | 3800 |
| Example 4 | 305 | 3750 |

TABLE 1-continued

|  | Dissolution rate (A/s) | |
| --- | --- | --- |
|  | Before exposure | After exposure |
| Example 5 | 290 | 3900 |
| Example 6 | 320 | 3400 |
| Example 7 | 290 | 3200 |
| Example 8 | 310 | 3450 |
| Comparative Example 1 | 340 | 375 |
| Comparative Example 2 | 4260 | 4400 |
| Comparative Example 3 | 1310 | 1360 |
| Comparative Example 4 | 1180 | 1200 |

Referring to Table 1, Comparative Examples 1 to 4 with no photosensitive functional group exhibit similar solubility before and after the exposure. In contrast, Examples 1 to 8 having a photosensitive functional group exhibit a similar dissolution speed before the exposure to that of Comparative Example 1 and a remarkably low dissolution speed compared with a conventionally-used polybenzoxazole precursor of Comparative Examples 3 and 4 but an increased dissolution speed after the exposure similar to that of Comparative Example 2. Based on the results, the polybenzoxazole precursor protected by a photosensitive functional group at the terminal end (carboxylic acid) exhibits a maximized solubility difference before and after the exposure.

(2) Measurement of Sensitivity, Resolution, and Film Residue Ratio

The positive photosensitive resin compositions according to Examples 1 to 8 and Comparative Examples 1 to 4 are respectively coated on an 8-inch wafer or an ITO substrate by using a spin-coater (1H-DX2, Mikasa Co., Ltd.) and heated on a hot plate at 120° C. for 100 seconds to form a photosensitive polybenzoxazole precursor film.

The photosensitive polybenzoxazole precursor film is exposed by using a mask patterned into various sizes and varying exposure time with a i-line stepper (NSR i10C, Nikon Co.), dipped in a 2.38 wt % tetramethylammonium hydroxide aqueous solution at room temperature for 80 seconds to dissolve and remove the exposed part, and washed with pure water for 30 seconds, obtaining a pattern. Subsequently, the obtained pattern is cured at 250° C./40 minutes under an oxygen concentration of less than or equal to 1000 ppm by using an electric furnace. The film pattern is observed through an optical microscope to evaluate its resolution. Thickness change of the film after the pre-baking, development, and curing is measured by using equipment (ST4000-DLX, K-mac).

Sensitivity of the photosensitive resin composition is measured by measuring exposure time taken until a 10 μm L/S pattern is formed to have a 1:1 line width after the exposure and development and regarding the exposure time as a maximum exposure time.

In addition, storage stability is calculated by storing the compositions at room temperature and measuring the number of days until the compositions exhibit the same coating thickness and exposure performance, that is, coating thickness and exposure performance of the compositions exhibit an abnormal behavior, and the results are provided in the following Table 2.

TABLE 2

|  | Film thickness (μm) | | Sensitivity | | | |
| --- | --- | --- | --- | --- | --- | --- |
|  | Pre-baking | After development | L/S = 10 μm (mJ/cm$^2$) | Resolution (μm) | Storage stability (day) | Tapered angle (°) |
| Ex. 1 | 4.61 | 4.11 | 88 | 2.5 | 13 | 41 |
| Ex. 2 | 4.55 | 4.18 | 80 | 2.2 | 13 | 42 |
| Ex. 3 | 4.58 | 4.15 | 85 | 2.4 | 12 | 40 |
| Ex. 4 | 4.49 | 3.95 | 83 | 2.2 | 11 | 42 |
| Ex. 5 | 4.71 | 4.22 | 91 | 2.7 | 13 | 41 |
| Ex. 6 | 4.65 | 4.17 | 87 | 2.6 | 12 | 40 |
| Ex. 7 | 4.53 | 4.10 | 82 | 2.5 | 13 | 39 |
| Ex. 8 | 4.45 | 3.99 | 86 | 2.5 | 12 | 41 |
| Comp. Ex. 1 | 4.58 | 4.37 | 160 | 3.5 | 12 | 40 |
| Comp. Ex. 2 | 4.68 | 3.10 | 110 | 3.3 | 13 | 38 |
| Comp. Ex. 3 | 4.54 | 3.74 | 120 | 3.1 | 13 | 36 |
| Comp. Ex. 4 | 4.50 | 3.75 | 131 | 3.2 | 6 | 42 |

Referring to Table 2, the compositions according to Examples 1 to 8 exhibit a higher film residue ratio and lower sensitivity than the compositions according to Comparative Examples 1 to 4. Specifically, the resins having a photosensitive functional group at the terminal end according to Examples 1 to 8 exhibit low solubility for a developing solution in a non-exposed part as Comparative Example 1 did but increased solubility in an exposed part as Comparative Example 3 did and thus, improved sensitivity.

Considering the above results, the polybenzoxazole precursor according to one embodiment may improve sensitivity compared with a conventional polybenzoxazole precursor and form an organic insulation layer having excellent performance.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A positive photosensitive resin composition, comprising:
   (A) a polybenzoxazole precursor including a functional group at a terminal end, wherein the functional group is dissociated by light of about 400 nm to about 550 nm wavelength region and is acidified;
   (B) a photosensitive diazoquinone compound; and
   (C) a solvent,
   wherein the functional group is represented by the following Chemical Formula 1:

[Chemical Formula 1]

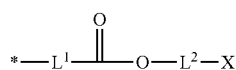

wherein, in the above Chemical Formula 1,
L$^1$ and L$^2$ are the same or different and are each independently a single bond, substituted or unsubstituted C1 to C20 alkylene, substituted or unsubstituted C1 to C20 arylene, substituted or unsubstituted C1 to C20 heteroarylene, or a combination thereof, and X is substituted or unsubstituted C1 to C20 alkyl, substituted or unsubstituted C2 to C20 alkenyl, substituted or unsubstituted C2 to C20 alkenyl, substituted or unsubstituted C6 to C20 aryl, substituted or unsubstituted C1 to C20 heteroaryl, —C(O)R wherein R is substituted or unsubstituted C1 to C20 aryl, or a combination thereof.

2. The positive photosensitive resin composition of claim 1, wherein X is selected from one or more of the following Chemical Formula 2 to Chemical Formula 5:

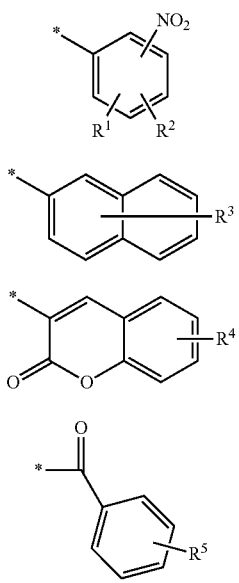

[Chemical Formula 2]

[Chemical Formula 3]

[Chemical Formula 4]

[Chemical Formula 5]

wherein, in the above Chemical Formula 2 to Chemical Formula 5, $R^1$ to $R^5$ are the same or different and are each independently hydrogen, a hydroxy group, a nitro group, substituted or unsubstituted C1 to C10 alkyl, a substituted or unsubstituted C1 to C10 alkoxy group, or a substituted or unsubstituted amino group.

3. The positive photosensitive resin composition of claim 1, wherein $L^1$ is represented by the following Chemical Formula 6:

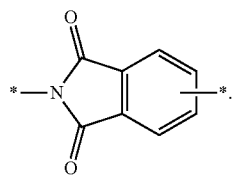

[Chemical Formula 6]

4. The positive photosensitive resin composition of claim 1, wherein the polybenzoxazole precursor comprises a structural unit represented by the following Chemical Formula 7:

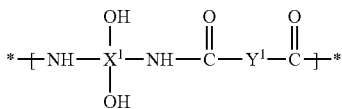

[Chemical Formula 7]

wherein, in the above Chemical Formula 7, each $X^1$ is the same or different and each is independently a substituted or unsubstituted C6 to C30 aromatic organic group, and each $Y^1$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

5. The positive photosensitive resin composition of claim 1, wherein the positive photosensitive resin composition further comprise a dissolution-controlling agent represented by the following Chemical Formula 8:

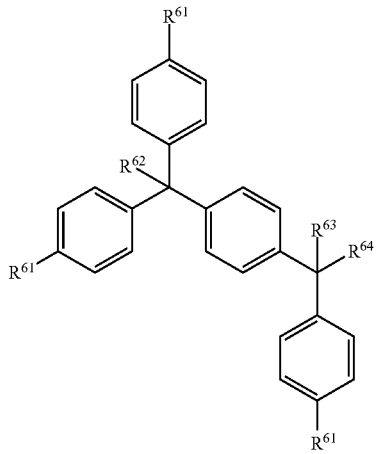

[Chemical Formula 8]

wherein, in the above Chemical Formula 8, each $R^{61}$ is independently hydrogen, a hydroxy group, or substituted or unsubstituted C1 to C10 alkyl, and $R^{62}$ to $R^{64}$ are the same or different and are each independently substituted or unsubstituted C1 to C10 alkyl.

6. The positive photosensitive resin composition of claim 1, wherein the positive photosensitive resin composition comprises:

about 5 to about 100 parts by weight of the photosensitive diazoquinone compound (B); and about 100 to about 900 parts by weight of the solvent (C) each based on about 100 parts by weight of the polybenzoxazole precursor (A).

7. The positive photosensitive resin composition of claim 1, wherein the positive photosensitive resin composition further comprises an additive including a surfactant, a leveling agent, a silane coupling agent, a thermal acid generator, or a combination thereof.

8. A resin film pattern formed by the process of coating the positive photosensitive resin composition of claim 1 on a substrate to form a photosensitive resin composition layer; exposing the photosensitive resin composition layer; and developing the exposed photosensitive resin composition layer to make the resin film pattern.

9. A display device comprising the resin film pattern of claim 8.

* * * * *